United States Patent [19]

Garboushian

[11] 3,916,434

[45] Oct. 28, 1975

[54] HERMETICALLY SEALED ENCAPSULATION OF SEMICONDUCTOR DEVICES

[75] Inventor: Vahan Garboushian, Torrance, Calif.

[73] Assignee: Power Hybrids, Inc., Torrance, Calif.

[22] Filed: Dec. 10, 1973

[21] Appl. No.: 423,157

Related U.S. Application Data

[63] Continuation of Ser. No. 310,950, Nov. 30, 1972, abandoned.

[52] U.S. Cl. ........................ 357/74; 357/70; 357/80; 357/81; 174/52 S; 338/84 M

[51] Int. Cl.².................... H01L 23/02; H01L 23/12

[58] Field of Search................. 317/234 A, 234 GN; 174/52 S; 338/84 M

[56] References Cited

UNITED STATES PATENTS

| | | | |
|---|---|---|---|
| 3,364,400 | 1/1968 | Granberry | 317/234 |
| 3,387,190 | 6/1968 | Winkler | 317/234 |
| 3,449,640 | 6/1969 | Franklin | 317/234 G |
| 3,663,868 | 5/1972 | Noguchi et al. | 317/234 G |
| 3,748,544 | 7/1973 | Noren | 317/234 G |
| 3,784,883 | 1/1974 | Duncan et al. | 317/234 A |
| 3,784,884 | 1/1974 | Zoroglu | 317/234 G |
| 3,801,881 | 4/1974 | Anazawa | 317/234 G |
| 3,801,938 | 4/1974 | Goshgarian | 338/84 M |
| 3,808,475 | 4/1974 | Buelow et al. | 317/235 R |

*Primary Examiner*—Andrew J. James

*Attorney, Agent, or Firm*—Ralf H. Siegemund

[57] ABSTRACT

Semi-conductor devices and other miniature circuit elements are hermetically sealed by mounting them on a peripherally metallized ceramic carrier, brazing a metal ring to carrier and brazing a ceramic cover onto the ring; the cover has also peripheral metallization, so that the hermetic seal results from metal-to-metal bond. The carrier is provided with metallized apertures as electrical feed through into the space as defined by carrier, ring and cover. Metal leads are soldered to the metallization of the apertures on the outside of the carrier, while connections are made from the circuit elements to the metallization of and around the apertures in the said inside mounting space.

23 Claims, 7 Drawing Figures

HERMETICALLY SEALED ENCAPSULATION OF SEMICONDUCTOR DEVICES

RELATED APPLICATION

This is a continuation of my application Ser. No. 310,950, filed Nov. 30, 1972, which is now abandoned.

BACKGROUND OF THE INVENTION

The present invention relates to hermetically sealed encapsulation of miniature circuit elements such as semi-conductor devices, particularly of the variety which may dissipate significant amounts of power.

Hermetically sealed, within the context of this invention, is to mean to have a leakage rate of $10^{-8}$ or better, as between helium at 1 atmosphere pressure and vacuum A hermetic seal in the mounting structure for semi-conductor elements while providing insulative feed through for current leads has not yet been successfully achieved. Epoxy is usually used for sealing and encapsulating semi-conductor elements but is not sufficient to meet the low leakage rate mentioned above. Other seals have usually failed because of the metal-to-ceramic bond involved. It must be born in mind, that sealing can be completed only after semi-conductor elements have been mounted at locations which will become the interior of the enclosure, and it is, therefore, not possible to make any conductor feed through sealing that requires excessive temperatures.

DESCRIPTION OF THE INVENTION

It is an object of the present invention to provide a mounting structure for miniature circuit elements including semi-conductor devices and which provides for hermetically sealed encapsulation under the stated conditions.

In accordance with the preferred embodiment of the invention, a flat ceramic carrier element is used having a plurality of metallized apertures from one side to the other. Contact leads for external circuit connection are, e.g., soldered to the metallization of the apertures as extending into one side of the carrier. These leads are, or can be, kept insulated from each other on that side. The metallization linings of the apertures merge in individual metallization islands on the other side of the carrier. That other side is provided additionally with metallization which circumscribes, possibly individually, the islands as defined and is kept separated from them. The metallization does, however, define a closed metallization path about all islands, preferably along the periphery of this other side of the carrier. A peripherally metallized, ceramic cover or cap is connected to said closed path through metal-to-metal connection that is uninterrupted along that path; the path has configuration to circumscribe a hollow space above the islands and below the cover; the semiconductor device or devices to be encapsulated are located in that space. Electrodes of the device (or of plural, interconnected devices) connect to the said islands by wire-to-metallization bond.

All electrical connections into the space as referred to thus far, run through metallized apertures of the carrier, and the respective metallic leads are connected to this metallization on the carrier side that faces the inner space in which the semi-conductor device or devices are mounted in encapsulation. The corresponding external contact leads are all on the other side of the carrier. However, the metal connection along the path circumscribing the interior mounting space is also available as current lead in; in a preferred embodiment, a metal ring is interposed between carrier and cover metallizations and, e.g., soldered to these layers. The metal ring is connected to or integral with external leads, while internally the ring is conductively connected to the metal layer on the carrier as circumscribing the above-mentioned islands. This metal ring is preferably provided for always, even when not used as current lead in, so that the peripheral metallizations on cover and carrier are soldered to opposite sides of that ring.

It will be appreciated, that the only type of metal-to-ceramic interface needed results from metallization of ceramic, and these metallizations have specific configurations which include forming closed loops around areas to be encapsulated. Metal parts as such are only bonded to metallization layers, not to ceramic wherever such bond requires hermetic sealing. The ceramic metallization is preferably produced by a low temperature brazing followed by gold plating. All metal parts are preferably gold plated.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

Figure 1:
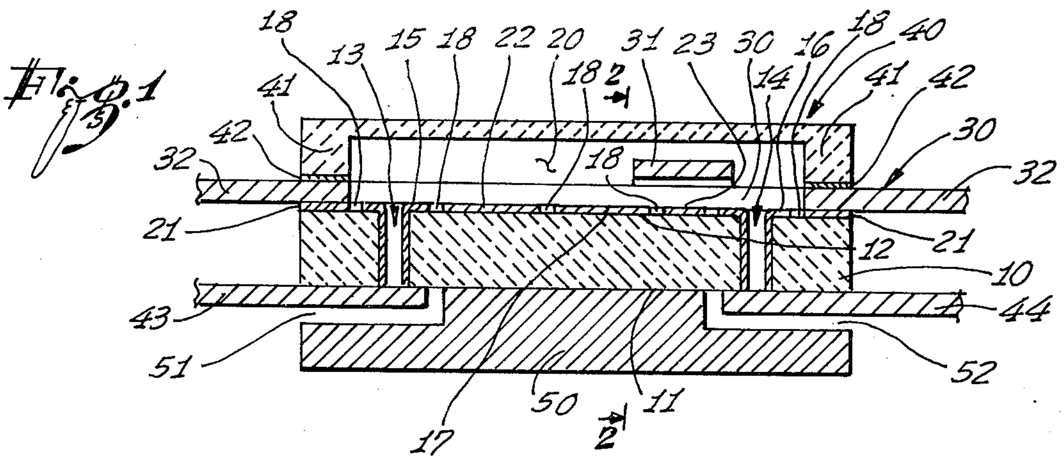
FIG. 1 is a cross-section through a semi-conductor mounting structure, constructed in accordance with the preferred embodiment of the invention, vertical dimensions have been distorted to render pertinent parts more readily identifiable.
Figure 2:
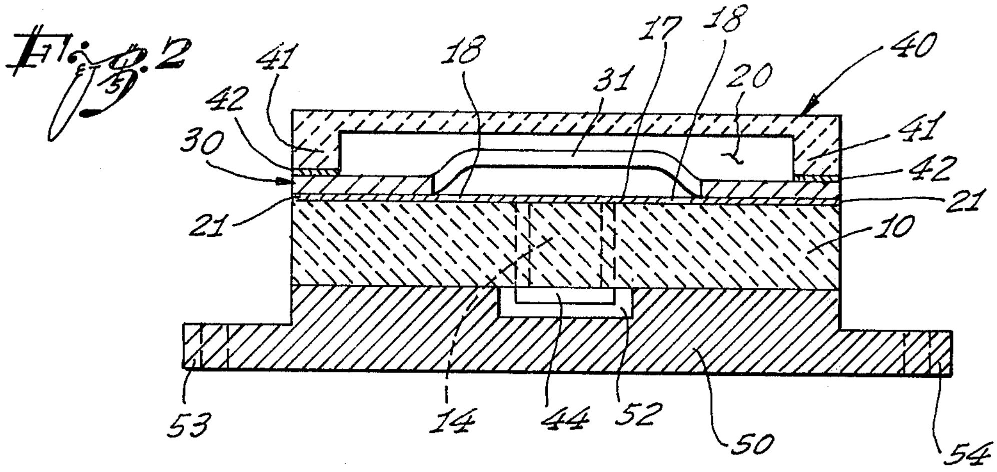
FIG. 2 is a section along lines 2—2 of FIG. 1.
Figure 3:
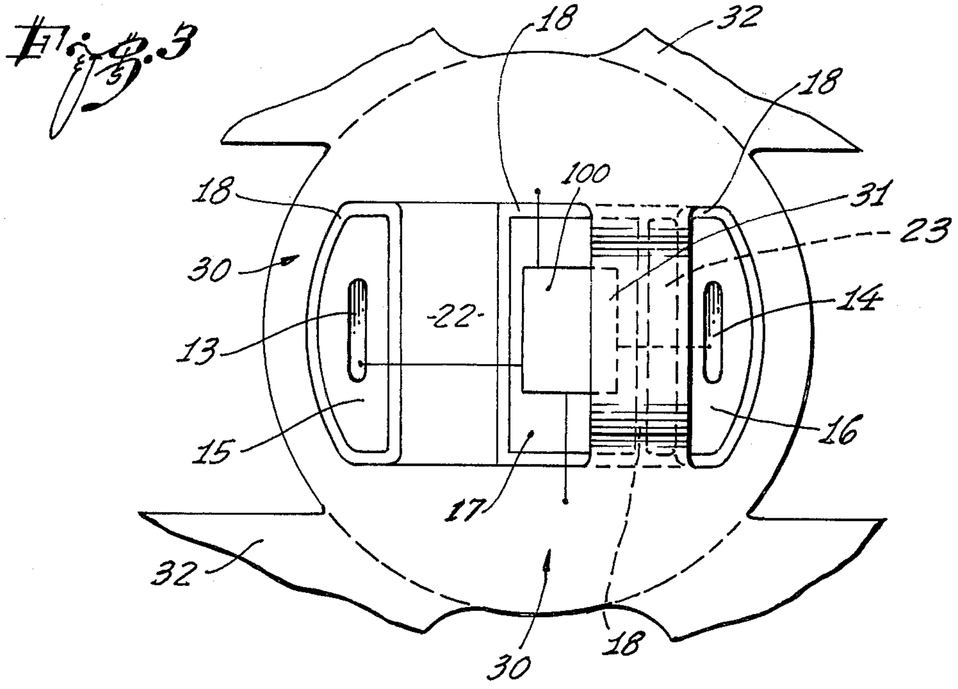
FIG. 3 is a top elevation of a portion of the device as shown in FIGS. 1 and 2, with the cover removed.
Figure 4:
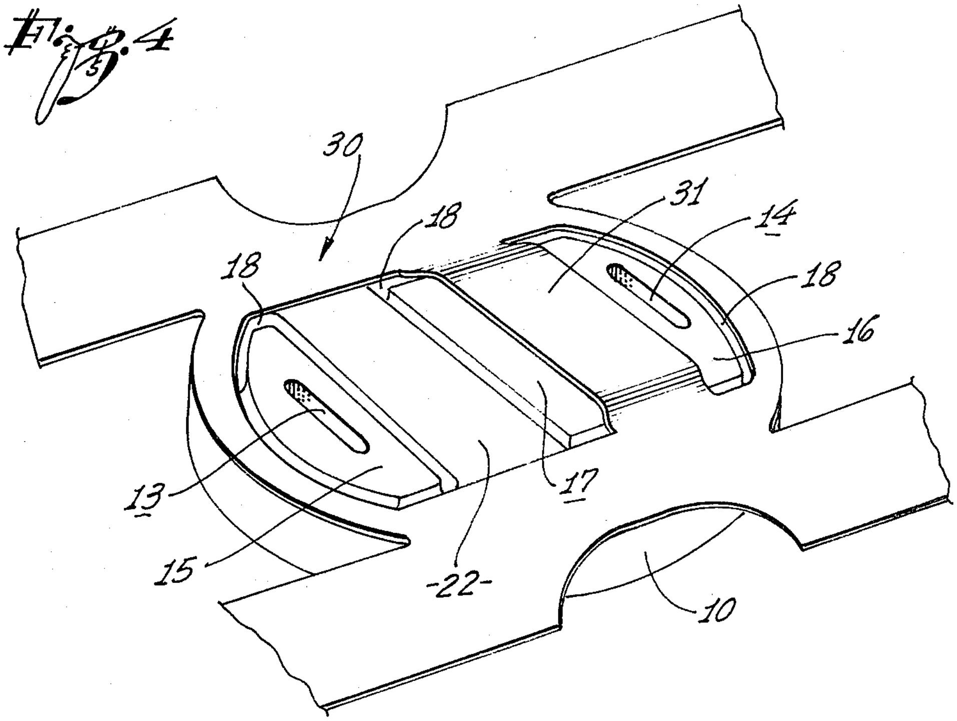
FIG. 4 is a perspective view of the device of FIG. 3.

Proceeding now to the detailed description of the drawings, I turn specifically to FIGS. 1 through 4, showing basically a mounting structure for miniature circuit devices, such as a power transistor with series capacitor and which appears to the "external world" as a three-electrode device. The mounting structure provides hermetically sealed encapsulation of these miniature circuit elements.

The mounting structure includes a berryllium oxide ceramic carrier 10 having flat, round, disk-shaped configuration, with two flat sides 11 and 12 accordingly. The carrier has two apertures 13 and 14 leading from side 11 to side 12. The side walls of the apertures are metallized. Here and in the following and unless stated otherwise, metallized is to mean that the respective substrate or surface metallized has been treated by a high temperature brazing step, followed by gold plating.

The metallizations extend respectively to metallized islands 15 and 16 on side 12 of the carrier. Side 11 is additionally covered with a planar metallization layer, which has the following characteristics and portions.

The layer extends along the periphery of side 11 of carrier 10 in an uninterrupted, gapless configuration 21 of metallization. The layer is coherent, but does not cover side 11 completely. Rather, there are three gap areas, one around island 15, a second one around island 16 and a third one around an island 17 of metallization. The metallization layer is, thus, separated from these islands and insulated from them accordingly, leaving non-metallized gap spaces 18 accordingly.

The layer defines a wide bridge 22 and a narrow bridge 23, connecting the annular, peripheral metallization ring 21 across paths which run transversely to a hypothetical connecting line of symmetry as between openings 13 and 14, bypassing the islands. It can thus be seen, that wide electric current paths are provided in the metillization layer as covering the side 11 completely except for the islands.

A metal ring 30, either made of gold or at least gold plated, is hot brazed to the annular metallization 21, providing therefor an uninterrupted metallic bond connection between layer 21 and ring 30. The ring is provided with a bridge 31, providing a broader current path parallel to but in the vicinity of narrow metallization bridge 23. Lead-in vanes 32 are integral with ring 30, and they are provided in symmetric configuration.

A ceramic cap or cover 40 has a ledge 41 which bears an annular uninterrupted metallization layer 42. The upper side of ring 30 is hard, hot soldered to layer 42 and provides uninterrupted metal bond connection between these elements. As a consequence, a hermetically sealed space 20 and cavity is defined by and in between carrier 10, ring 30 and cap 40. A true hermetic seal results from the fact that carrier 11 bears a metallization ring which is soldered to one side of ring 30, while metallization annulus 42 of cap 40 is soldered to the other side of ring 30. No metal-to-ceramic bond is established except by the metallization layers provided, e.g., through brazing, as stated above. The apertures 13 and 14 are sealed on side 12 in that the leads 43 and 44 are respectively soldered to the metallization lining of the apertures 13 and 14. Again then, there is only metal-to-metal bonding involved for sealing. The leads are additionally cemented to the ceramic of carrier 10. The lead strength was found to be significant.

The structure is completed as far as its mounting features are concerned, by a metal disk 50 serving as heat sink and being cemented to side 12 where not occupied by the external electrode leads 43 and 44. Recesses 51 and 52 provide electrical separation of the heat sink from the leads. The disk 50 has lugs 53 and 54 with apertures for mounting of the entire structure to a chassis or the like.

It can readily be seen, that the mounting and encapsulation structure provides for three electrical feed-through connections into the interior space 35 of the arrangement, which connections are all electrically insulated from each other as well as from the heat sink mount 50. Hence, none of the three connectors has to be connected to chassis ground.

A first connection includes electrode lead 43, the metal lining of aperture 13 and island 15. A second connection includes lead 44, the metal lining of aperture 14 and island 16. The third connection includes the lead vanes 32 of ring 30, the ring itself and integral layer portions 21, 22 and 23. It can readily be seen, that current flow is symmetrically distributed in the ring 30 by operation of bridge 31, as well as of bridges 22 and 23. Island 17 is isolated from all these connections, and none of them is connected (or has inherent connection) to metallic heat sink and mount 50. None of the connections leading into the cavity 20 requires metal-to-ceramic bond of a lead, as the ceramic-to-metal bond results exclusively from metallizations (brazing), and any actual leads (47, 45, 30) are soldered to such metallization.

Figures 5, 6, 7:
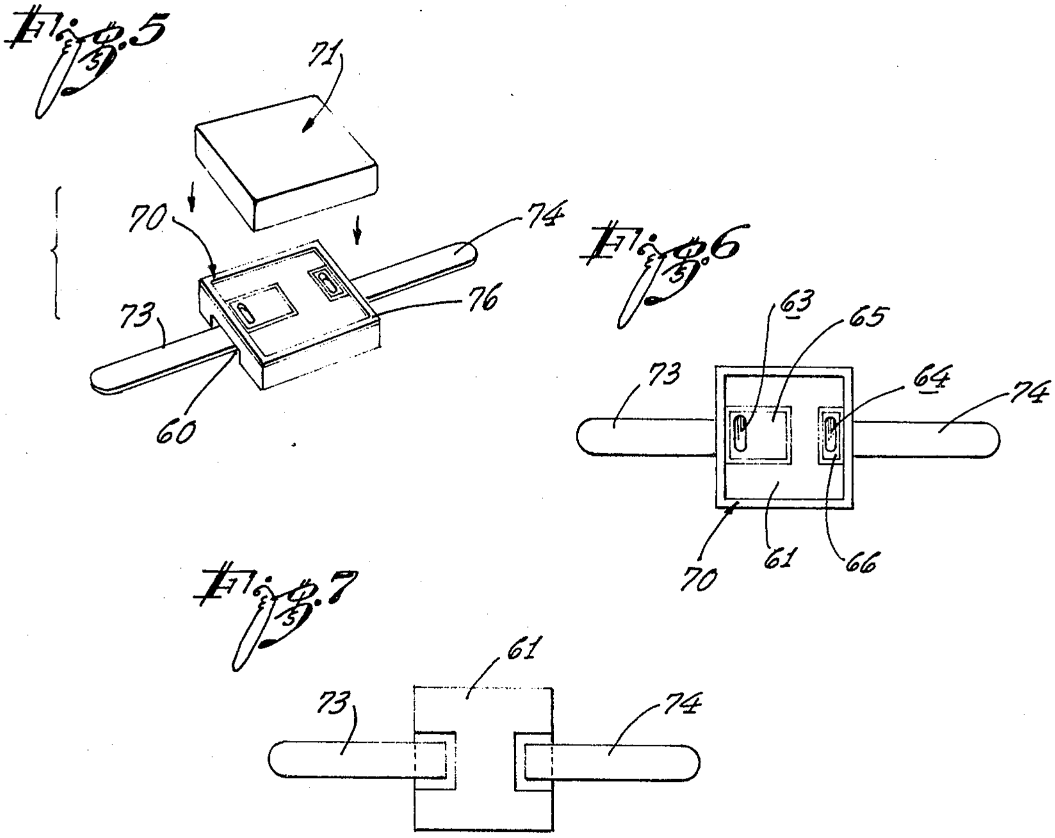
FIG. 5 is an exploded or disassembled view of a simplified construction in accordance with the preferred embodiment.
FIGS. 6 and 7 are respectively top and bottom views of the lower part of the illustration of FIG. 5.

A semi-conductor device 100, such as a power transistor, may be mounted on island 17 with a series-connected diode or capacitor mounted on bridge 22. Connectors can then be strung from the various electrodes proper of the semi-conductor elements to the islands 15 and 16 and soldered thereto. Additional connections may run between these elements. The metalization layer including ring 21 and bridges 22, 23 as well as island 17 establish a flat mounting surface for these elements Turning briefly now to FIGS. 5, 6 and 7, there is illustrated a simpler version for practicing the invention, to be used either for encapsulating a power diode or a transistor of which one electrode can be connected to chassis ground. The device includes a ceramic carrier 60 of flat, rectangular configuration, having both sides metallized 61, except for space for two islands 65 and 66 on one side, and space for metal leads 73 and 74 on the other side. As before, metallized apertures 63 and 64 traverse the carrier, and the metallization is soldered to the two leads 73 and 74. These leads are cemented to carrier 60 at the underside and where exposed by recesses in the metallization, as shown in FIG. 7. It should be mentioned, that the thin sides of carrier 60 are also metallized except around portions adjacent leads 73, 74.

A metal element 70 of square configuration is soldered to metallization 61, providing an uninterrupted metal bond thereto along the square shaped periphery of the upper one of the metallized sides of carrier 60, as shown in FIGS. 5 and 6. A ceramic cap 71, likewise of square configuration with metallized ledge, is soldered to ring 70, so that an internal mounting space is established between cap and carrier. The semiconductor element is disposed in that space and here particularly on island 65, and the electrodes of the semi-conductor element are connected to the metallization layers within that space and as required.

The invention is not limited to the embodiments described above but all changes and modifications thereof not constituting departures from the spirit and scope of the invention are intended to be included.

I claim:

1. A hermetically sealed encapsulating structure for a semi-conductor device with electrode feed-through, comprising:

a ceramic carrier wafer having opposite sides and two spaced-apart apertures, leading from one to the side, the two apertures being lined by metallization, there being metallization islands on said other side, separated from each other and continuing the respective metallization of the apertures;

first and second metal leads in spaced-apart disposition on one side of said carrier and respectively in metallic bond with the metallization of the apertures, the leads respectively covering the apertures on the one side and sealingly closing same by metallic bond with the metallization;

a coherent metallization layer on the other side of the carrier, not covering the said other side completely, leaving at least two exposed areas including at least one area each around said apertures and said islands but extending uninterruptedly around the periphery of the one side of the carrier and extending contiguously with the peripheral portion of the layer between said exposed areas, for separating them on that other side of the carrier;

a ceramic cap having a uninterrupted metallized periphery on one side, and metallic means for sealingly connecting said cap to said carrier using exclusively metal-to-metal uninterrupted, hermetically sealed bond around the peripheries of the cap and the carrier, to establish a hermetically sealed interior space of the cap and carrier in the resulting cap and carrier assembly;

at least one semi-conductor device being disposed in the interior space as between the cap and the carrier and having electrodes connected to the respective metal lining of the openings as exposed to the interior of the cap and carrier assembly; said metallic means distributing ground potential around all said islands to obtain better electrical performance including lower parasitic inductance, and separating the said metal linings on the said other side physically as well as electrically.

2. An encapsulating structure as in claim 1, wherein the metal means includes a metal ring of uninterrupted configuration in metal bond with each of said layers and respectively along said peripheries thereof.

3. An encapsulating structure as in claim 2, wherein said metallization layer leaves three distinctly exposed areas, two around said openings, the third one in between said two areas but in asymmetric configuration, leaving a wide metallized bridge on one side, a narrow on the other side of the third area;

a metal bridge on the ring above and parallel to the narrow metallized bridge, the third area having a metallization island, separated and electrically insulated from said coherent layer, a semi-conductor device being mounted on said island; and a third metal lead connected to said ring.

4. An encapsulating structure as in claim 1, wherein metallization islands are respectively provided around said openings on said one side, in metal-to-metal bond to the metallization linings of the aperatures, separated from the coherent layer and within said exposed areas.

5. An encapsulating structure as in claim 1, including a metal heat sink bonded to the carrier on the other side, having recesses for insulative separation from said metal leads.

6. An encapsulating structure as in claim 1, wherein the metallization layer is flat, there being one additional exposed area with a flat metallization island, insulated from said layer but coplanar therewith, to provide mounting space that is flush with said layer.

7. In combination for use with a semi-conductor having a plurality of elements, a wafer made from a material having a high dielectric constant and defined by first and second opposite faces, there being at least a pair of apertures extending through the wafer in spaced relationship to each other, metallization layer means provided on the first face of the wafer and including at least two individual layers separated from each other and extending respectively through the apertures to the second face and separated by gaps to define a pair of conductive islands around the apertures on the first face for connection to individual ones of the elements in the semi-conductor, the layer means including an additional, uninterrupted metallization portion for connection to another one of the elements in the semi-conductor, circumscribing each of said islands but separated therefrom and including a portion that extends between the islands and a portion that circumscribes both said islands, the portion that extends between the islands provided to prevent capacitive coupling between the islands;

first means extending on the second face of the wafer to the apertures and providing connections to the conductive islands at the apertures and sealing the apertures with metallic seal and providing for external connections to the individual elements, second means on the first face of the wafer for providing electrical continuity to the circumscribing additional portion of the additional uninterrupted metallization portion of the metallization layer means, and third means providing a cover on the first face of the wafer for the semi-conductor and the pair of metallization islands and the additional metallization portion, in metal-to-metal contact with said second means.

8. The combination set forth in claim 7 wherein the means for providing continuity to the additional uninterrupted metallization portion of the metallization layer constitutes a metallic ring extending outwardly from the wafer along the periphery of the wafer.

9. The combination set forth in claim 8 wherein the cover means has a metallization layer contacting the metallic ring and the metallization layer on the cover means, the metallic ring and the metallization layer on the wafer are united to form a hermetic seal.

10. The combination set forth in claim 7 wherein a heat sink is disposed against the second face of the wafer to conduct heat from the wafer and is provided with recesses to separate the heat sink from the first means.

11. The combination set forth in claim 7, wherein a third metallization island is provided on the first face of the wafer between the first and second metallization islands for disposition of the semi-conductor on the third metallization island in electrically isolated relationship to the first and second metallization islands as well as to the additional metallization portion.

12. The combination set forth in claim 8, wherein a conductive bridge is connected to the metallic ring and disposed in the space between the cover means and the metallization layer means on the first face of the wafer to provide for a symmetrical distribution of current flow in the ring.

13. In combination, a semi-conductor having at least first, second and third elements controlling the operation of the semi-conductor, a wafer having a high dielectric constant and having first and second opposite faces and having first and second apertures spaced from each other and extending through the wafer between the first and second opposite faces of the wafer, first metallization layer means on the first face of the wafer, separated from each other and defining first and second islands disposed respectively around the first and second apertures and extending through the first and second apertures to the second face of the wafer;

second metallizatijon layer means on the first face of the wafer circumscribing both said islands but being separated from each of them;

third metallization layer means on the first face of the wafer and separated from each said first and second layer means;

the semi-conductor being disposed on the third metallization layer means and providing electrical continuity between the first element in the semiconductor and the second metallization layer and electrical connections being provided from the second element of the semi-conductor to the first metallization island and from the third element of the semi-conductor to the second metallization island, first and second conductors extending along the second face of the wafer and respectively providing electrical connections with the first and second metallization islands at the first and second apertures in the wafer, and means including a cover element having a high dielectric constant and a coherent metallization layer and being connected in metal-to-metal sealing connection to said second metallization layer means for providing a cover for the wafer at the first face of the wafer.

14. The combination set forth in claim 13 wherein the first and second conductors respectively seal the first and second apertures.

15. The combination set forth in claim 14 wherein the second metallization layer on the first face of the wafer extends around the periphery of the wafer and a metallization bond is provided between the cover means and the second metallization to hermetically seal the wafer.

16. The combination set forth in claim 13, and including fourth metallization layer means on the first face of the wafer continuous with said second layer means and extending between the first and second metallization islands to isolate the first and second metallization islands from any capacitive coupling.

17. The combination set forth in claim 16, wherein a metallic ring is electrically coupled between the second metallization layer means extending around the periphery of the portion to provide for an external connection to the first element on the semi-conductor, further being connected in metal-to-metal seal to said dielectric cover element.

18. The combination set forth in claim 13, wherein the cover means includes a cover element having a high dielectric constant and a metallization layer and being united in metal to metal sealing connection to the second metallization layer means to provide electrical continuity and establish a hermetic seal.

19. In combination for use with a semi-conductor having a plurality of elements to provide connections to the member and to seal the member, a wafer made from a material having a high dielectric constant and defined by first and second opposite faces and having first and second apertures spaced from each other and extending through the wafer between the first and second faces of the apertures, first metallization layer means provided on the first face of the wafer and defining first and second metallization islands disposed respectively around the first and second apertures and extending through the apertures; .

second metallization layer means on the first face of the wafer extending between the first and second metallization islands and being separated therefrom for distributing ground potential around all said islands to obtain better electrical performance including lower parasitic inductance;

first and second conductors extending along the second face of the wafer and respectively connected electrically to the first and second metallization islands at the first and second apertures, and means attached to the wafer to cover the second face of the wafer.

20. The combination set forth in claim 19 wherein the first and second conductors respectively seal the first and second apertures at the second face of the wafer.

21. The combination set forth in claim 19, wherein the first face of the wafer is shaped to receive and support the semi-conductor on an additional metallization portion.

22. The combination set forth in claim 19 a third metallization layer on the first face extending around the periphery of the first face of the wafer and wherein the cover means are united with the additional metallization portion around the periphery of such portion and wherein the first and second conductors respectively seal the first and second apertures at the second face of the wafer.

23. The combination set forth in claim 22 wherein a metallic ring is disposed on the additional metallization portion around the periphery of such portion and wherein the cover means is made from an insulating material and is provided with a metallization layer around the periphery of the cover means and the metallization layer on the cover means is united with the metallic ring and the metallic ring is united with the additional metallization portion to form a hermetic seal between the cover means and the wafer.

* * * * *